(12) United States Patent
Schwandner et al.

(10) Patent No.: US 8,529,315 B2
(45) Date of Patent: Sep. 10, 2013

(54) METHOD FOR PRODUCING A SEMICONDUCTOR WAFER

(75) Inventors: Juergen Schwandner, Garching (DE); Michael Kerstan, Burghausen (DE)

(73) Assignee: Siltronic AG, Munich (DE)

( * ) Notice: Subject to any disclaimer, the term of this patent is extended or adjusted under 35 U.S.C. 154(b) by 329 days.

(21) Appl. No.: 13/009,890

(22) Filed: Jan. 20, 2011

(65) Prior Publication Data
US 2011/0183582 A1 Jul. 28, 2011

(30) Foreign Application Priority Data
Jan. 27, 2010 (DE) .......... 10 2010 005 904

(51) Int. Cl.
*B24B 1/00* (2006.01)
(52) U.S. Cl.
USPC .......... 451/41; 451/57; 216/89; 257/E21.214; 438/692
(58) Field of Classification Search
USPC .......... 451/41, 57, 65, 285, 287; 216/88, 216/89; 257/E21.214; 438/691, 692, 693
See application file for complete search history.

(56) References Cited

U.S. PATENT DOCUMENTS

| | | | |
|---|---|---|---|
| 3,905,162 A | 9/1975 | Lawrence et al. | |
| 4,655,191 A | 4/1987 | Wells et al. | |
| 5,287,774 A | 2/1994 | Seifert | |
| 5,400,548 A | 3/1995 | Huber et al. | |
| 5,658,189 A | 8/1997 | Kagamida | |
| 5,989,105 A | 11/1999 | Kawakawaguchi et al. | |
| 6,007,407 A | 12/1999 | Rutherford et al. | |
| 6,174,222 B1 * | 1/2001 | Sato et al. | 451/44 |
| 6,599,177 B2 | 7/2003 | Nevoret et al. | |
| 6,602,117 B1 | 8/2003 | Chopra et al. | |
| 7,010,939 B2 * | 3/2006 | Yoshikawa et al. | 65/30.14 |
| 7,429,209 B2 * | 9/2008 | Horisaka et al. | 451/37 |
| 7,582,221 B2 * | 9/2009 | Netsu et al. | 216/88 |
| 8,298,916 B2 * | 10/2012 | Vaufredaz et al. | 438/459 |

(Continued)

FOREIGN PATENT DOCUMENTS

| | | |
|---|---|---|
| CN | 1650404 A | 8/2005 |
| CN | 1795545 A | 6/2006 |

(Continued)

*Primary Examiner* — Eileen P. Morgan
(74) *Attorney, Agent, or Firm* — Leydig, Voit & Mayer, Ltd.

(57) ABSTRACT

A method of producing a semiconductor wafer includes a plurality of steps carried out in the following order. Simultaneous double-side material-removal processing is carried out on a semiconductor wafer sliced from a single crystal by processing the semiconductor wafer between two rotating ring-shaped working disks. Each working disk includes first abrasives having an average grain size in a range of 5.0 to 20.0 μm. Both sides of the semiconductor wafer are treated with an alkaline medium. Grinding of the front and rear sides of the semiconductor wafer is carried out. For the grinding of each side a first side is held using a wafer holder and the other side is processed using a grinding tool. The grinding tool includes second abrasives having an average grain size that is smaller than the average grain size of the first abrasives and having an average grain size being in a range of 1.0 to 10.0 μm. Both sides are polished using a polishing pad including third abrasives having an average grain size in a range of 0.1 to 1.0 μm. The front side is polished using a stock removal polishing pad that is free of abrasives and a polishing agent containing fourth abrasives. The front side is then chemical mechanical polished.

12 Claims, 1 Drawing Sheet

(56) References Cited

U.S. PATENT DOCUMENTS

| | | |
|---|---|---|
| 2002/0077039 A1 | 6/2002 | Wenski et al. |
| 2002/0187595 A1* | 12/2002 | Walitzki et al. ............... 438/184 |
| 2003/0121285 A1* | 7/2003 | Kesuka et al. .................... 65/61 |
| 2003/0181141 A1 | 9/2003 | Taniguchi et al. |
| 2003/0228461 A1* | 12/2003 | Yoshikawa et al. .......... 428/325 |
| 2005/0142882 A1 | 6/2005 | Kida et al. |
| 2005/0227590 A1 | 10/2005 | Sung |
| 2006/0211338 A1 | 9/2006 | Heilmaier et al. |
| 2006/0258268 A1 | 11/2006 | Miyata et al. |
| 2007/0023395 A1 | 2/2007 | Asakawa |
| 2008/0014839 A1 | 1/2008 | Pietsch et al. |
| 2008/0113510 A1 | 5/2008 | Kato et al. |
| 2008/0305722 A1 | 12/2008 | Roettger et al. |
| 2009/0029552 A1 | 1/2009 | Schwandner et al. |
| 2009/0057840 A1* | 3/2009 | Netsu et al. ................... 257/618 |
| 2010/0330786 A1 | 12/2010 | Schwandner et al. |
| 2011/0081836 A1 | 4/2011 | Schwandner |
| 2011/0097974 A1 | 4/2011 | Schwandner et al. |
| 2011/0111677 A1 | 5/2011 | Schwandner |
| 2011/0133314 A1 | 6/2011 | Pietsch et al. |

FOREIGN PATENT DOCUMENTS

| | | |
|---|---|---|
| DE | 39 42 671 A1 | 6/1991 |
| DE | 195 35 616 A1 | 4/1996 |
| DE | 101 96 254 T5 | 6/2003 |
| DE | 103 44 602 A1 | 5/2005 |
| DE | 102005012446 A1 | 9/2006 |
| DE | 102006032455 A1 | 4/2008 |
| DE | 102006048218 A1 | 4/2008 |
| DE | 99/55491 A1 | 1/2009 |
| DE | 102007035266 A1 | 1/2009 |
| DE | 102009030296 A1 | 1/2011 |
| DE | 102009048436 A1 | 4/2011 |
| DE | 102009051007 A1 | 5/2011 |
| DE | 102009052744 A1 | 5/2011 |
| DE | 102009057593 A1 | 6/2011 |
| EP | 0 522 542 A1 | 1/1991 |
| EP | 0 433 956 A1 | 6/1991 |
| EP | 0 955 126 A2 | 11/1999 |
| EP | 1 049 145 A1 | 11/2000 |
| WO | 92/13680 A1 | 8/1992 |
| WO | 00/47369 A1 | 8/2000 |

* cited by examiner

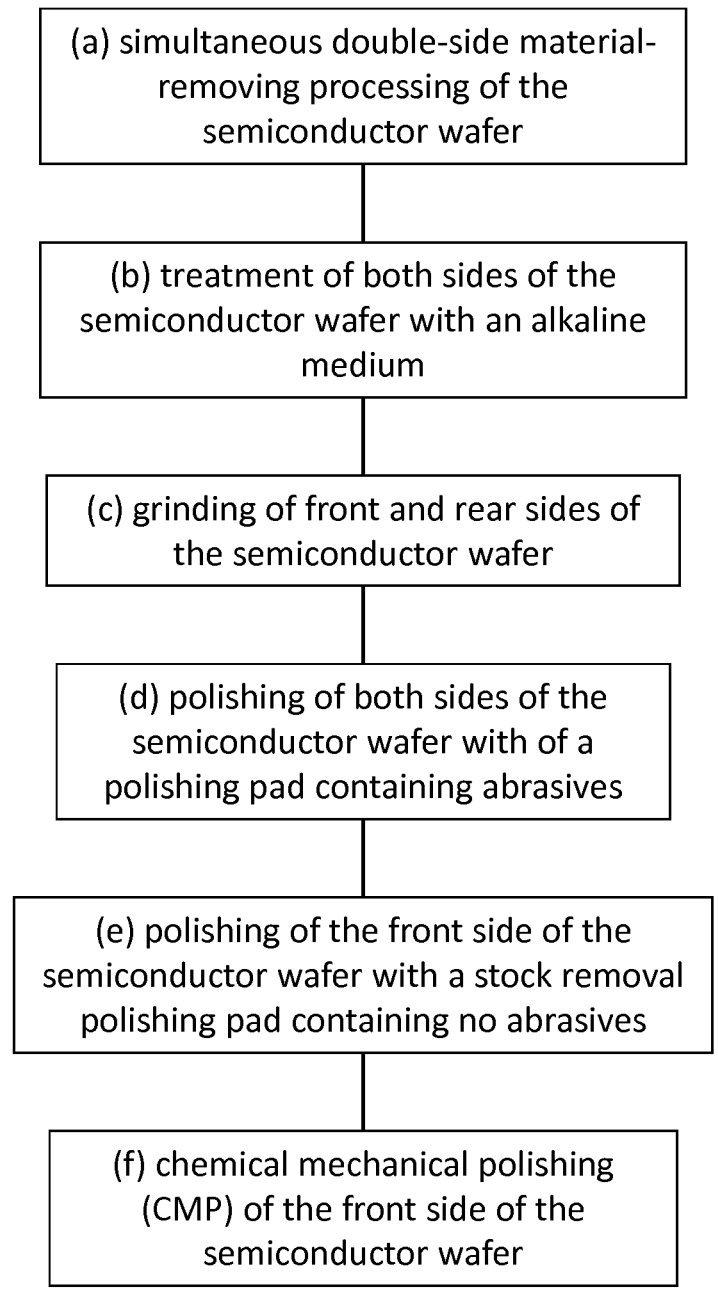

METHOD FOR PRODUCING A SEMICONDUCTOR WAFER

CROSS REFERENCE TO RELATED APPLICATIONS

This application claims priority to German Patent Application No. DE 10 2010 005 904.8, filed on Jan. 27, 2010, which is hereby incorporated by reference herein in its entirety.

FIELD

The present invention relates to a method for producing a semiconductor wafer.

BACKGROUND

Conventional semiconductor wafers are produced in a multiplicity of successive process steps, which can generally be subdivided into the following groups:
a) production of a single crystal composed of semiconductor material (crystal pulling);
b) separation of the semiconductor single crystal into individual wafers ("wafering", "sawing");
c) mechanical processing of the semiconductor wafers;
d) chemical processing of the semiconductor wafers;
e) chemomechanical processing of the semiconductor wafers;
f) thermal treatment of the semiconductor wafers and/or epitaxial coating of the semiconductor wafers.

In addition there are a multiplicity of secondary steps such as cleaning, measuring and packaging.

A semiconductor single crystal is usually produced by pulling a single crystal from a melt (CZ or "Czochralski" method) or by recrystallizing a rod composed of polycrystalline semiconductor material (FZ or "floating zone" method).

Known separation methods include wire sawing ("multi-wire slicing", MWS) and internal-diameter sawing.

In the case of wire sawing, a multiplicity of semiconductor wafers are sliced from a piece of crystal in one work operation.

The mechanical processing serves for removing sawing undulations, for removing the surface layers that were damaged in crystalline fashion by the rougher sawing processes or were contaminated by the sawing wire, and primarily for global leveling of the semiconductor wafers. Surface grinding (single-side, double-side) and lapping are used here, and also mechanical edge processing steps.

In the case of single-side grinding, the semiconductor wafer is held on the rear side on a support ("chuck") and leveled on the front side by a cup grinding disk with rotation of support and grinding disk and slow radial advance. Methods and apparatuses for the surface grinding of a semiconductor wafer are described in U.S. Pat. Nos. 3,905,162 and 5,400,548 or EP-0955126, for example, each of which is incorporated by reference herein. In this case, a semiconductor wafer is fixedly held on a wafer holder by one of its surfaces, while its opposite surface is processed by means of a grinding disk, by wafer holder and grinding disk rotating and being pressed against one another. In this case, the semiconductor wafer is fixed on the wafer holder in such a way that its center substantially corresponds to the rotation center of the wafer holder. Moreover, the grinding disk is positioned in such a way that the rotation center of the semiconductor wafer reaches a working region or the edge region formed by teeth of the grinding disk. As a result, the entire surface of the semiconductor wafer can be ground without any movement in the grinding plane.

In the case of simultaneous double-side grinding ("double-disk grinding", DDG), the semiconductor wafer is simultaneously processed on both sides in a manner floating freely between two grinding disks mounted on opposite collinear spindles, and in the process is guided in a manner largely free of constraining forces axially between a water cushion (hydrostatic principle) or air cushion (aerostatic principle) acting on the front and rear sides, and is prevented from floating away radially loosely by a surrounding thin guide ring or by individual radial spokes.

In the case of lapping, the semiconductor wafers are moved under a specific pressure with supply of a slurry containing abrasive materials between an upper and a lower working disk, which are usually composed of steel and normally provided with channels for better distribution of the lapping agent, whereby semiconductor material is removed.

DE 103 44 602 A1 and DE 10 2006 032 455 A1, which are incorporated by reference herein describe methods for the simultaneous grinding at the same time of both sides of a plurality of semiconductor wafers with a movement sequence similar to that of lapping, but characterized by the fact that abrasive is used which is fixedly bonded in working layers ("films", "pads") applied to the working disks. A method of this type is referred to as "fine grinding with lapping kinematics" or "planetary pad grinding" (PPG).

Working layers which are used in the case of PPG and which are adhesively bonded onto the two working disks are described for example in U.S. Pat. Nos. 6,007,407 A and 6,599,177 B2, which are incorporated by reference herein. During processing, the semiconductor wafers are inserted into thin guide cages, so-called carriers, which have corresponding openings for receiving semiconductor wafers. The carriers have an outer toothing which engages into a rolling apparatus comprising inner and outer toothed rings and are moved by means of said rolling apparatus in the working gap formed between upper and lower working disks.

The edge of the semiconductor wafer including any existing mechanical markings such as an orientation notch is usually processed as well ("edge rounding", "edge notch grinding"). Conventional grinding steps with profiled grinding disks or belt grinding methods with continuous or periodic tool advance are used for this purpose.

These edge rounding methods are usually provided since the edge in the unprocessed state is particularly fracture-sensitive and the semiconductor wafer can be damaged even by slight pressure and/or temperature loads in the edge region.

The wafer edge that has been ground and treated with an etching medium is usually polished in a later processing step. In this case, the edge of a centrally rotating semiconductor wafer is pressed against a centrally rotating polishing drum with a specific force (contact pressure). U.S. Pat. No. 5,989, 105, which is incorporated by reference herein describes an edge polishing method of this type wherein the polishing drum is composed of an aluminum alloy and has a polishing pad applied to it. The semiconductor wafer is usually fixed on a flat wafer holder, a so-called chuck. The edge of the semiconductor wafer projects beyond the chuck, such that it is freely accessible for the polishing drum.

The group of chemical processing steps usually comprises wet-chemical cleaning and/or etching steps.

The group of chemomechanical processing steps comprises polishing steps by which, through in part chemical reaction and in part mechanical material removal (abrasion), the surface is smoothed and residual damage of the surface is removed.

While the polishing methods that work on one side ("single-side polishing") generally lead to poorer plane-parallelisms, polishing methods acting on both sides ("double-side polishing") make it possible to produce semiconductor wafers having improved flatness.

After the grinding, cleaning and etching steps, in accordance with conventional methods, the surface of the semiconductor wafers is smoothed by stock removal polishing. In the case of single-side polishing (SSP), semiconductor wafers are held on the rear side on a support plate by means of cement, by vacuum or by means of adhesion during processing. In the case of double-side polishing (DSP), semiconductor wafers are loosely inserted into a thin toothed disk and polished on the front and rear sides simultaneously in "freely floating" fashion between an upper and a lower polishing plate covered with a polishing pad.

Furthermore, the front sides of the semiconductor wafers are often polished in haze-free fashion, for example by means of a soft polishing pad with the aid of an alkaline polishing sol. This step is often referred to as CMP polishing ("chemo-mechanical polishing") in the literature. CMP methods are described, for example, in US 2002-0077039 and in US 2008-0305722, which are incorporated by reference herein.

Conventional methods may also include the so-called "fixed abrasive polishing" (FAP) technologies, wherein the silicon wafer is polished on a polishing pad which, however, contains an abrasive material bonded in the polishing pad ("fixed-abrasive pad"). A polishing step in which such an FAP polishing pad is used is hereinafter referred to for short as FAP step.

WO 99/55491 A1, which is incorporated by reference herein, describes a two-stage polishing method, comprising a first FAP polishing step and a subsequent second CMP polishing step. In CMP, the polishing pad contains no bonded abrasive material. Here, as in the case of a DSP step, abrasive material is introduced in the form of a slurry between the silicon wafer and the polishing pad. Such a two-stage polishing method is used, in particular, to eliminate scratches left by the FAP step on the polished surface of the substrate.

The German patent application DE 102 007 035 266 A1, which is incorporated by reference herein, describes a method for polishing a substrate composed of silicon material, comprising two polishing steps of the FAP type, which differ in that in one polishing step a polishing agent slurry containing unbonded abrasive material as solid is introduced between the substrate and the polishing pad, while in the second polishing step the polishing agent slurry is replaced by a polishing agent solution that is free of solids.

Semiconductor wafers are often provided with an epitaxial layer, that is to say with a layer grown in monocrystalline fashion and having the same crystal orientation, on which semiconductor components are applied later. Such epitaxially coated semiconductor wafers have certain advantages over semiconductor wafers composed of homogeneous material, for example the prevention of charge reversal in bipolar CMOS circuits followed by the short circuit of the component ("latch-up" problem), lower defect densities (for example reduced number of COPs ("crystal-originated particles")) and the absence of an appreciable oxygen content, whereby it is possible to rule out a short-circuit risk owing to oxygen precipitates in component-relevant regions.

What is important is how the above-described mechanical and chemomechanical or purely chemical method steps are arranged in a process sequence for producing a semiconductor wafer.

It is known that the conventional polishing steps such as SSP, DSP and CMP, the etching treatments and the epitaxy step lead to a deterioration in the flatness of the semiconductor wafer particularly in the edge region.

Endeavors have been made to minimize the material removal during polishing, in order also to limit the deterioration in flatness to a minimum.

For this purpose, it has been proposed, for example, to introduce a fine grinding step. Fine grinding means that grinding tools with finer granulation than in the case of DDG are used.

The advantages of such fine grinding are described in DE 10 2005 012 446 A1, which is incorporated by reference herein. The material removals during etching and polishing can be reduced by means of fine grinding. This makes it possible to prevent the good geometry after the grinding steps such as DDG or PPG from being overly impaired by subsequent etching and polishing.

However, the nanotopography of the semiconductor wafer also plays an important part. The nanotopography can be expressed for example as a height fluctuation PV (="peak to valley"), relative to square measurement windows having an area of 2 mm×2 mm.

The Nanomapper® instrument from KLA Tencor is often used for examining the nanotopography.

This interferometer is suitable for measuring the topography in the range of from −20 nm to +20 nm on the front side of a semiconductor wafer. During the measurements, the semiconductor wafer is situated on a soft, flat wafer holder (chuck). The resulting peak-to-valley (PV) values are filtered (Gaussian high-pass filter) and analyzed on circles with a diameter of 2 mm (additionally also on circles with a diameter of 10 mm) with respect to peak-to-valley deviations. In the THA ("threshold height analysis") analysis, for details see SEMI standard M43, the three sigma PV value is finally calculated from the distribution of all the PV values as a so-called THA value.

The THA values are often also referred to as THA-2 mm or THA-10 mm in order to indicate the size of the analysis windows. It has been found that although fine grinding allows smaller etching and polishing removals, it has an adverse influence on the THA-2 mm value, that is to say is associated with an impairment of the shorter-wave nanotopography.

Such topography differences also often occur in the form of so-called striations. These striations can be attributed to fluctuations in the dopant concentrations. These striated structures become apparent after chemical or chemomechanical processing steps.

In the German patent application bearing the file reference 102009030296.4, not previously published, which is incorporated by reference herein, it is indicated that the FAP-polishing could afford advantages in this regard.

Finally, the edge geometry of the semiconductor wafers is also important. In order to make even the outermost edge region of the semiconductor wafer accessible to the modern lithographic methods (immersion lithography), improvements in the edge geometry are indispensable. It has been suggested that conventional DSP polishing, in particular with respect to the new generation of 450 mm wafers, should be replaced in this regard by new polishing methods.

SUMMARY

In view of the foregoing the present invention provides a novel process sequence for producing semiconductor wafers which achieves both good geometry and good nanotopography of the semiconductor wafers and is also suitable for 450 mm wafers.

In an embodiment, the present invention provides a method of processing a semiconductor wafer that includes a plurality of steps carried out in the following order. Simultaneous double-side material-removal processing is carried out on a semiconductor wafer sliced from a single crystal by processing the semiconductor wafer between two rotating ring-shaped working disks. Each working disk includes first abrasives having an average grain size in a range of 5.0 to 20.0 μm. Both sides of the semiconductor wafer are treated with an alkaline medium. Grinding of the front and rear sides of the semiconductor wafer is carried out. For the grinding of each side a first side is held using a wafer holder and the other side is processed using a grinding tool. The grinding tool includes second abrasives having an average grain size that is smaller than the average grain size of the first abrasives and having an average grain size being in a range of 1.0 to 10.0 μm. Both sides are polished using a polishing pad including third abrasives having an average grain size in a range of 0.1 to 1.0 μm. The front side is polished using a stock removal polishing pad that is free of abrasives and a polishing agent containing fourth abrasives. The front side is then chemical mechanical polished.

BRIEF DESCRIPTION OF THE DRAWINGS

Exemplary embodiments of the present invention are described in more detail in the following with reference to the drawings, in which:

FIG. 1 shows a flow chart of a method of processing a semiconductor wafer.

DETAILED DESCRIPTION

FIG. 1 shows a method of processing a semiconductor wafer that includes the following steps carried out in the stated order:

Step (a) includes simultaneous double-side material-removal processing of a semiconductor wafer sliced from a single crystal. The material removal processing can be carried out between two rotating ring-shaped working disks, wherein each working disk contains abrasives having an average grain size of 5.0-20.0 μm.

Step (b) includes treatment of both sides of the semiconductor wafer with an alkaline medium.

Step (c) includes grinding the front and rear sides of the semiconductor wafer. In each case one side of the semiconductor wafer is fixedly held by means of a wafer holder, while the other side is processed by means of a grinding tool. The grinding tool contains abrasives having an average grain size of 1.0-10.0 μm, wherein the average grain size of the abrasives is less than the average grain size of the abrasives of the working disks used in step (a).

Step (d) includes polishing of both sides of the semiconductor wafer by means of a polishing pad containing abrasives having an average grain size of 0.1-1.0 μm.

Step (e) includes polishing of the front side of the semiconductor wafer by means of a stock removal polishing pad containing no abrasives. A polishing agent containing abrasives is supplied during the polishing.

Step (f) includes chemical mechanical polishing (CMP) of the front side of the semiconductor wafer.

A method according to an embodiment of the invention comprises, in step (a), simultaneous double-side processing of front and rear sides of the semiconductor wafer, wherein this step involves a coarse grinding of the semiconductor wafer, while step (c) provides a fine grinding of the semiconductor wafer, which is effected sequentially on front and rear sides.

Step a) can be DDG or PPG.

PPG is preferred. In this case, the semiconductor wafer lies in the cutout in a carrier in a manner similar to that in the case of lapping and DSP.

In addition, with regard to the processing of the surfaces of the semiconductor wafer, an FAP polishing of front and rear sides in step (d) and a CMP polishing of the front side of the semiconductor wafer in step (f) are provided.

Step (e) is a stock removal polishing process, wherein, however, in contrast to DSP, only the front side of the semiconductor wafer is polished.

Firstly, a semiconductor wafer is sliced from a single crystal composed of semiconductor material, grown by means of CZ or FZ. The semiconductor wafer is preferably sliced by means of a wire saw. The slicing of the semiconductor wafer by means of a wire saw is effected in the manner described e.g. in U.S. Pat. No. 4,655,191, EP 522 542 A1, DE 39 42 671 A1 or EP 433 956 A1, which are incorporated by reference herein.

The grown single crystal composed of semiconductor material is preferably a single crystal composed of silicon.

The semiconductor wafer is preferably a monocrystalline silicon wafer.

The edge of the semiconductor wafer is preferably polished before or after step (f), that is to say the CMP polishing.

It is also preferred to carry out two edge polishing processes, wherein a first edge polishing process takes place before the CMP polishing and a second edge polishing process takes place after the CMP polishing, wherein the second edge polishing process preferably takes place using a softly removing silica sol (soft edge polishing).

Preferably, after slicing the semiconductor wafer from the single crystal and before grinding the surfaces of the semiconductor wafer in accordance with step (a), a process of rounding the edge of the semiconductor wafer using a coarse abrasive takes place. In this case, the semiconductor wafer is provided with a rounded edge.

For this purpose, the semiconductor wafer is fixed on a rotating table and delivered by its edge against the likewise rotating working surface of a processing tool. The processing tools used in this case can be embodied as disks which are secured to a spindle and have circumferential surfaces serving as working surfaces for processing the edge of the semiconductor wafer.

An apparatus suitable for this purpose is disclosed in DE 195 35 616 A1, for example, which is incorporated by reference herein.

Preferably, the semiconductor wafers are provided with a profile that is symmetrical with respect to the central plane of the wafer, with facets of identical type on the front side of the wafer and the rear side of the wafer or else with an asymmetrical edge profile with different facet widths on the front and rear sides. In this case, the edge of the semiconductor wafer acquires a profile that is geometrically similar to a target profile.

The grinding disk used preferably has a grooved profile. A preferred grinding disk is disclosed in DE 102 006 048 218 A1, which is incorporated by reference herein.

The working surfaces can also be embodied in the form of an abrasive cloth or as an abrasive belt.

The material-removing grain, preferably diamond, can be fixedly anchored in the working surfaces of the processing tools. The grain used has a coarse granulation. According to JIS R 6001:1998, the granulation (in mesh) is #240-#800.

The average grain size is 20-60 µm, preferably 25-40 µm, especially preferably 25-30 µm or 30-40 µm.

Step (a) of the method involves carrying out double-side material-removing processing of the semiconductor wafer sliced from a single crystal, using a coarse abrasive.

In this case, both sides of the semiconductor wafer are subjected to material-removing processing.

The processing is preferably effected by means of DDG in accordance with the prior art.

The processing of the semiconductor wafer by means of PPG is especially preferred.

Sequential processings of the semiconductor wafer in which one side of the semiconductor wafer is fixed ("chucked") on a wafer holder, while the other side of the semiconductor wafer is treated by means of a grinding tool, are not preferred at this juncture in the method.

PPG is a method for the simultaneous double-side grinding of a plurality of semiconductor wafers, wherein each semiconductor wafer lies in freely movable fashion in a cutout in one of a plurality of carriers that are caused to rotate by means of a rolling apparatus, and is thereby moved on a cycloidal trajectory, wherein the semiconductor wafers are processed in material-removing fashion between two rotating working disks, wherein each working disk comprises a working layer containing bonded abrasive.

A hard material having a Mohs hardness of $\geqq 6$ is preferred as abrasive bonded in the working layers. Appropriate abrasive materials are preferably diamond, silicon carbide (SiC), cerium dioxide ($CeO_2$), corundum (aluminum oxide, $Al_2O_3$), zirconium dioxide ($ZrO_2$), boron nitride (BN; cubic boron nitride, CBN), furthermore silicon dioxide ($SiO_2$), boron carbide ($B_4C$), through to significantly softer materials such as barium carbonate ($BaCO_3$), calcium carbonate ($CaCO_3$) or magnesium carbonate ($MgCO_3$). Diamond, silicon carbide (SiC) and aluminum oxide ($Al_2O_3$; corundum) are particularly preferred, however.

The average grain size of the abrasive is 5-20 µm, preferably 5-15 µm and especially preferably 5-10 µm.

The abrasive particles are preferably bonded individually or as clusters in the bonding matrix of the working layer. In the case of cluster bonding, the grain diameters specified as preferred relate to the primary particle size of the cluster constituents.

Working layers with ceramic bonding are preferably used; a synthetic resin bonding is particularly preferred; in the case of working layers with clusters also a hybrid-bonded system (ceramic bonding within the clusters and synthetic resin bonding between clusters and working layer matrix).

That temperature prevailing in the working gap formed between the working layers is preferably kept constant during processing. For this purpose, the carriers can have openings through which cooling lubricant can be exchanged between lower and upper working disks, such that upper and lower working layers always have the same temperature. This counteracts an undesired deformation of the working gap formed between the working layers as a result of the deformation of the working layers or working disks on account of thermal expansion under alternating load. Moreover, the cooling of the abrasives bonded in the working layers is improved and becomes more uniform, and the effective service life thereof is thereby increased.

It is preferred to determine the form of the working gap formed between the working layers during grinding and to alter the form of the working surface of at least one working disk mechanically or thermally depending on the measured geometry of the working gap in such a way that the working gap has a predefined form.

Preferably, the semiconductor wafers temporarily leave the working gap, delimited by the working layers, with a part of their surface during processing, wherein the maximum of the excursion in the radial direction is more than 0% and at most 20% of the diameter of the semiconductor wafer, the excursion being defined as the length—measured relative to the working disks in the radial direction—by which a semiconductor wafer projects beyond the inner or outer edge of the working gap at a specific point in time during grinding.

Preferably, toward the end of processing, a liquid medium having a viscosity of at least $3 \cdot 10^{-3}$ $N/m^2 \cdot s$ and at most $100 \cdot 10^{-3}$ $N/m^2 \cdot s$ is introduced between working disks and semiconductor wafers via openings in the carriers. This medium should be present at least while the working disks are being removed from the semiconductor wafer, thereby curbing the mechanical removal by the working layers. Grinding defects that are otherwise observed in the prior art, such as marks, scratches or lift-off marks, can thereby be avoided. This is described in the German application—not previously published—bearing the file reference 10 2009 048 436.1, to which in its entirety reference is made here.

The following preferably come into consideration as the medium:
  aqueous mixture containing polyhydric alcohols (glycerol, monomeric glycols, oligomeric glycols, polyglycols and polyalcohols)
  aqueous mixture of glycerol, butanol and a surfactant
  slurries, wherein the required viscosity of the medium is ensured by the proportion of solids (colloidal dispersions composed of silicon dioxide or cerium oxide particles), preferably with additional viscosity-increasing media (e.g. alcohols) depending on the proportion of solids.

Step (b) of the method involves treating front and rear sides of the semiconductor wafer with an alkaline medium.

Aqueous solutions of NaOH or KOH are preferably used as alkaline media.

The concentration of NaOH or KOH in the alkaline solution is preferably 40% to 60%.

The treatment temperature is preferably approximately 50° C. to 90° C., especially preferably 80° C. to 90° C.

It has been found that the alkaline etching does not adversely influence the good geometry and the good longer-wave nanotopology after the grinding steps, in particular after PPG. Acidic etching is disadvantageous in this regard and should be avoided.

However, the surface roughness is higher after alkaline etching than after comparable treatments using acidic media.

The treatment with the alkaline medium is preferably effected as single-wafer treatment. This is particularly preferred in particular for semiconductor wafers having a diameter of greater than 300 mm, that is to say in particular for semiconductor wafers having a diameter of 450 mm.

Step (c) of the method according to the invention involves material-removing processing of the semiconductor wafer using a finer abrasive than in step (a).

In step (c) of the method, both sides of the semiconductor wafer are ground.

In contrast to step (a), the grinding of front and rear sides has to be effected sequentially. DDG or PPG fine grinding is unsuitable in the context of this invention.

For this purpose, the semiconductor wafer held on a wafer holder and a grinding disk lying opposite are rotated independently of one another, the grinding disk being arranged in a manner laterally offset relative to the semiconductor wafer and in this case being positioned in such a way that an axial center of the semiconductor wafer reaches a working region of the grinding disk, the grinding disk being moved at an advancing speed in the direction of the semiconductor wafer, whereby grinding disk and semiconductor wafer are delivered to one another, while semiconductor wafer and grinding disk rotate about parallel axes, such that a surface of the semiconductor wafer is ground, the grinding disk being led back at a returning speed after a specific material removal has been attained.

It is preferred for grinding disk and semiconductor wafer to be delivered by a distance of 0.03-0.5 µm during a revolution of the semiconductor wafer. The choice of delivery during a revolution of the semiconductor wafer of 0.03-0.1 µm is especially preferred.

Preferably, a grinding disk having a grain size of greater than or equal to #1200 is used, especially preferably #1200-#8000.

The grain size is usually specified in # ("mesh") in accordance with Japanese Industrial Standard JIS R 6001:1998.

An average particle size can be calculated from the mesh figures:

if grinding disks having fine granulation are used, the term fine grinding is often also employed. Such fine grinding disks have e.g. a granulation of from #1000 up to #4000, e.g. those commercially available from Disco Corporation.

It emerges during the conversion into particle sizes that, by way of example, #1200 corresponds to an average particle size of 9.5 µm, #5000 corresponds to an average particle size of 2.5 µm and #8000 corresponds to an average particle size of 1.2 µm.

The average particle sizes during fine grinding are therefore approximately greater than or equal to 1.0 µm and less than or equal to 10 µm, preferably 1.0-7 µm, particularly preferably 1.0-4 µm and especially preferably 1.0-2 µm.

The rotational speed of the grinding disk is preferably 1000-5000 $min^{-1}$.

The rotational speed of the semiconductor wafer is preferably 50-300 $min^{-1}$, especially preferably 200-300 $min^{-1}$.

The advancing speed is preferably 10-20 µm/min.

The increased surface roughness after the alkaline etching can be reduced by means of the fine grinding. A roughness of approximately 25 nm (RMS, 250 µm filter) remains.

The good geometry obtained up to this point in time and the good nanotopography are not adversely influenced in any way by the fine grinding.

It is furthermore preferred to configure the fine grinding such that a slightly convex form of the wafer results.

An edge rounding step is preferably effected after the fine grinding of front and rear sides of the semiconductor wafer and before the FAP polishing in accordance with step (d). If a first edge rounding step had already been carried out before step (a), which is preferred, a grinding tool having finer granulation by comparison with the first edge rounding process is used in the second edge rounding step.

For this purpose, the semiconductor wafer is once again fixed on a rotating table and delivered by its edge against the likewise rotating work surface of a processing tool. The processing tools used in this case can be embodied as disks which are secured to a spindle and have circumferential surfaces serving as working surfaces for processing the edge of the semiconductor wafer.

The working surfaces can also be embodied in the form of an abrasive cloth or as an abrasive belt.

The material-removing grain, preferably diamond, can be fixedly anchored into the working surfaces of the processing tools.

The grain used has a fine granulation. According to JIS R 6001:1998, the granulation should be finer than #800, preferably #800-#8000.

The average grain size is 0.5-20 µm, preferably 0.5-15 µm, particularly preferably 0.5-10 µm, and especially preferably 0.5-5 µm.

In step (d), both sides of the semiconductor wafer are polished by means of a polishing pad containing abrasives having an average grain size of 0.1-1.0 µm.

The polishing of front and rear sides of the semiconductor wafer can be effected simultaneously at the same time. Conventional DSP polishing machines are suitable for this purpose, the polishing pads used containing abrasives.

However, the polishing of the two sides can also be effected sequentially, in which case the silicon wafers are polished in holding systems with hard retainer plates, i.e. holding systems with membranes are not used. The sequential polishing by means of polishing pads comprising abrasives opens up the possibility, particularly when polishing wafers having very large diameters, that is to say having diameters of greater than 300 mm—in particular diameters of 450 mm—of coordinating the polishing steps for the front and rear sides with one another in a targeted manner, with regard to optimized polishing of the wafer edge regions (ERO).

In the context of the sequential polishing, there is additionally the possibility, between the two polishing steps, of carrying out a measurement of the wafer edge profile, e.g. by means of the "Kobelco LER 310" measuring instrument, and thus optimally adapting the second polishing process to the first. This measurement also makes it possible to characterize regions with an edge exclusion of less 1 mm.

During the polishing step, a polishing agent solution that is free of solids is preferably introduced between the sides of the semiconductor wafer which are to be polished and the polishing pad.

The polishing agent solution is, in the simplest case, water, preferably deionized water (DIW) having the purity customary for use in the semiconductor industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof. The use of potassium carbonate is especially preferred. In this case, the pH value of the polishing agent solution preferably lies in a range of 10 to 12 and the proportion of the stated compounds in the polishing agent solution is preferably 0.01 to 10% by weight, particularly preferably from 0.01 to 0.2% by weight.

The polishing agent solution can furthermore contain one or more further additives, for example surface-active additives such as wetting agents and surfactants, stabilizers acting as protective colloids, preservatives, biocides, alcohols and complexing agents.

A polishing pad is used which contains an abrasive material bonded in the polishing pad (FAP pad).

Suitable abrasive materials comprise for example particles of oxides of the elements cerium, aluminum, silicon, zirconium and particles of hard materials such as silicon carbide, boron nitride and diamond.

Particularly suitable polishing pads have a surface topography characterized by replicated microstructures. Said microstructures ("posts") have for example the form of columns having a cylindrical or polygonal cross section or the form of pyramids or truncated pyramids.

More detailed descriptions of such polishing pads are contained for example in WO 92/13680 A1 and US 2005/227590 A1, which are incorporated by reference herein.

The use of a polishing pad having cerium oxide abrasives fixedly bonded therein, as described e.g. in U.S. Pat. No. 6,602,117 B1, which is incorporated by reference herein, is especially preferred.

The average particle size of the abrasives is particularly preferably 0.1-0.6 μm.

An average particle size of 0.1-0.25 μm is especially preferred.

Removals of greater than or equal to 2 μm per side are preferably employed for the FAP polishing, where in this regard the range of 2-4 μm is particularly preferred and a range of 2-3 μm is especially preferably employed.

The FAP polishing makes it possible firstly to eliminate the damage produced by the fine grinding. Secondly, the roughness of approximately 25 nm that remains after the fine grinding is significantly reduced to less than or equal to 4 nm (RMS, 250 μm filter).

In particular the striations observed in the case of highly doped semiconductor wafers can be removed by FAP. In this regard, the German patent application bearing the file reference 102009057593.6, not previously published, is incorporated by reference herein in its entirety.

It is not least as a result of this that an improvement in the shorter-wave nanotopography is achieved by means of FAP.

Step (e) of the method according to embodiments of the invention involves polishing the front side of the semiconductor wafer by means of a stock removal polishing pad. The rear side of the semiconductor wafer is not polished.

During the polishing, a polishing agent based on colloidally disperse silica sol is introduced between polishing pad and front side of the semiconductor wafer.

In this case, the semiconductor wafer is fixed with the FAP-polished rear side preferably on a support plate of a polishing machine, wherein a uniform, thin cement layer having at most a thickness of 3 μm is used for fixing, and, finally, the front side of the semiconductor wafer is subjected to polishing. With regard to the cement layers used, the unpublished German patent application bearing the file reference 102009052744.3 is incorporated by reference herein in its entirety.

As an alternative, the semiconductor wafer is held during polishing, by means of a holding system which is fixed on a carrier and which comprises a lined cutout of the size of the semiconductor wafer to be received, by the side that is not to be polished by means of adhesion in the cutout.

Such holding systems having cutouts for receiving a semiconductor wafer are also referred to as templates.

With regard to the templates used, the unpublished German patent application bearing the file reference 102009051007.9 is incorporated by reference herein in its entirety.

A typical stock removal polishing pad is used during the polishing of the front side. Commercially available polishing pads are e.g. the pads of the DCP series and also the pads having the trade names IC1000™, Polytex™ or SUBA™ from Rohm & Haas.

A typical hard stock removal polishing pad without abrasives contained therein is involved. Abrasives are supplied in the form of a polishing agent.

This stock removal polishing serves to eliminate the microdamage caused by FAP.

The material removal on the front side is preferably approximately 1.0 to 2.0 μm, particularly preferably approximately 1.0 to 1.5 μm.

After step (e), polishing of the edge of the semiconductor wafer is preferably effected. However, this can also follow step (f), as already mentioned above.

Commercially available automatic edge-polishing units are suitable for this purpose.

U.S. Pat. No. 5,989,105, which is incorporated by reference herein, discloses such an apparatus for edge polishing, wherein the polishing drum is composed of an aluminum alloy and has a polishing pad applied to it.

The semiconductor wafer is usually fixed on a flat wafer holder, a so-called chuck. The edge of the semiconductor wafer projects beyond the chuck, such that it is freely accessible for the polishing drum. A centrally rotating polishing drum, to which the polishing pad is applied and which is inclined by a specific angle with respect to the chuck, and the chuck with the semiconductor wafer are delivered to one another and pressed onto one another with a specific contact pressure while the polishing agent is continuously supplied.

During the edge polishing, the chuck with the semiconductor wafer held thereon is rotated centrally.

Preferably, one revolution of the chuck lasts 20-300 s, particularly preferably 50-150 s (revolution time).

A polishing drum, which is covered with the polishing pad and is preferably rotated centrally at a rotational speed of 300-1500 $min^{-1}$, particularly preferably 500-1000 $min^{-1}$, and the chuck are delivered to one another, with the polishing drum being set obliquely at a setting angle with respect to the semiconductor wafer and the semiconductor wafer being fixed on the chuck in such a way that it projects slightly beyond the latter and is therefore accessible for the polishing drum.

The setting angle is preferably 30-50°.

Semiconductor wafer and polishing drum are pressed onto one another with a specific contact pressure and with a polishing agent being supplied continuously, preferably with a polishing agent flow rate of 0.1-1 liter/min, particularly preferably 0.15-0.40 liter/min, wherein the contact pressure can be set by means of weights attached to rolls and is preferably 1-5 kg, particularly preferably 2-4 kg.

Polishing drum and semiconductor wafer are preferably moved away from one another after 2-20, particularly preferably after 2-8, revolutions of the semiconductor wafer or of the chuck holding the semiconductor wafer.

The edge polishing of the semiconductor wafer is preferably effected by fixing the semiconductor wafer on a centrally rotating chuck, delivering the semiconductor wafer and a centrally rotating polishing drum, to which a polishing pad containing fixedly bonded abrasives (FAP polishing pad) is applied and which is inclined with respect to the chuck, and pressing semiconductor wafer and polishing drum onto one another with the continuous supply of a polishing agent solution containing no solids.

This makes it possible to influence the wafer edge in a targeted manner without impairing the adjoining region of front and/or rear side of the semiconductor wafer, and thus for example to set the desired geometry and surface properties only on the wafer edge.

A short polishing step using softly removing silica sol can additionally follow on the same FAP polishing pad, in order to realize a reduction of the edge roughness and edge defect rates.

The two polishing steps can then be coordinated with one another such that a targeted positive influencing of the wafer edge geometry and surface can be performed without adverse influencing of the wafer partial sites on the wafer front side and wafer rear side.

In principle, therefore, the semiconductor wafer is preferably polished by means of a polishing drum, adhesively bonded on the surface of which is a hard and not very compressible polishing pad comprising fixedly bonded abrasives, with an alkaline solution being supplied.

Preferably, a smoothing step is subsequently effected in a second step on the same polishing pad while a silica sol is supplied, such as e.g. Glanzox 3900* with approximately 1% by weight of $SiO_2$.

*Glanzox 3900 is the product name for a polishing agent slurry offered as a concentrate by Fujimi Incorporated, Japan. The base solution of this concentrate has a pH of 10.5 and contains approximately 9% by weight of colloidal $SiO_2$ having an average particle size of 30 to 40 nm.

The polishing agent solution used during the edge polishing is, in the simplest case, water, preferably deionized water (DIW) having the purity customary for use in the semiconductor industry.

However, the polishing agent solution can also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any desired mixtures thereof.

The use of potassium carbonate is especially preferred.

The pH value of the polishing agent solution preferably lies in a range of 10 to 12 and the proportion of the stated compounds in the polishing agent solution is preferably 0.01 to 10% by weight, particularly preferably from 0.01 to 0.2% by weight.

A polishing agent containing abrasives is used in the preferred second step of the edge polishing. This step preferably takes place after step (f), wherein the first edge polishing process takes place between step (e) and step (f).

The proportion of the abrasive material in the polishing agent slurry is preferably 0.25 to 20% by weight, particularly preferably 0.25 to 1% by weight.

The average particle size is 5 to 300 nm, particularly preferably 5 to 50 nm.

The abrasive material comprises a material that mechanically removes the substrate material, preferably one or more of the oxides of the elements aluminum, cerium or silicon.

A polishing agent slurry containing colloidally disperse silica is particularly preferred.

Preferably, therefore, a polishing pad containing an abrasive material bonded in the polishing pad is used in the edge polishing. The polishing pads used in this case correspond to the FAP polishing pads used in step (d) in this case.

Step (f) of the method involves chemical mechanical polishing of the front side of the semiconductor wafer, that is to say conventional CMP polishing of the front side of the semiconductor wafer.

Here, too, the rear side of the semiconductor wafer is preferably fixed by means of wax or templates, as described in step (e).

The CMP polishing pads used are polishing pads having a porous matrix.

The polishing pad preferably comprises a thermoplastic or heat-curable polymer. A multiplicity of substances may be envisaged for the material, for example polyurethanes, polycarbonate, polyamide, polyacrylate, polyester, etc.

The polishing pad preferably comprises solid, microporous polyurethane.

It is also preferred to use polishing pads composed of foamed plates or felt or fiber substrates, which are impregnated with polymers.

Coated/impregnated polishing pads can also be configured such that there are a different pore distribution and different pore sizes in the substrate than in the coating.

The polishing pads can be substantially flat or else perforated.

In order to control the porosity of the polishing pad, fillers can be introduced into the polishing pad.

One commercially available polishing pad is, for example, the SPM 3100 from Rodel Inc.

A silica sol is preferably supplied as polishing agent, that is to say introduced between front side of the semiconductor wafer and polishing pad during the polishing.

The material removal is preferably at most 0.5 µm on the front side of the semiconductor wafer.

What is claimed is:

1. A method of producing a semiconductor wafer comprising the following steps in the recited order:
   (a) simultaneous double-side material-removal processing a semiconductor wafer sliced from a single crystal by processing the semiconductor wafer between two rotating ring-shaped working disks, each working disk including first abrasives having an average grain size in a range of 5.0 to 20.0 µm;
   (b) treating both sides of the semiconductor wafer with an alkaline medium;
   (c) grinding a front side and a rear side of the semiconductor wafer, the grinding of each side including fixedly holding a first of the front and rear sides using a wafer holder and processing the other of the front and rear sides using a grinding tool, the grinding tool including second abrasives having an average grain size that is smaller than the average grain size of the first abrasives and having an average grain size being in a range of 1.0 to 10.0 µm;
   (d) polishing both sides of the semiconductor wafer using a polishing pad including third abrasives having an average grain size in a range of 0.1 to 1.0 µm;
   (e) polishing the front side of the semiconductor wafer using a stock removal polishing pad that is free of abrasives and a polishing agent containing fourth abrasives; and
   (f) chemical mechanical polishing the front side of the semiconductor wafer.

2. The method as recited in claim 1, further comprising slicing the semiconductor wafer from a single crystal.

3. The method as recited in claim 1, wherein step (a) includes disposing the semiconductor wafer in freely movable fashion in a cutout of one of a plurality of carriers and rotating the plurality of carriers so as to move the semiconductor wafer on a cycloidal trajectory, and wherein the each working disk includes a working layer including the first abrasives.

4. The method as recited in claim 1, wherein during step (a) the semiconductor wafer extends outward in a radial direction from a working gap between the working disks, wherein a maximum extent of outward extension is more than 0% of a diameter of the semiconductor wafer and no more than 20% of the diameter of the semiconductor wafer.

5. The method as recited in claim 3, wherein during step (a) the semiconductor wafer extends outward in a radial direction from a working gap between the working layers of the working disks, wherein a maximum extent of outward extension is more than 0% of a diameter of the semiconductor wafer and no more than 20% of the diameter of the semiconductor wafer.

6. The method as recited in claim 1, wherein the alkaline medium includes an aqueous solution of NaOH or KOH.

7. The method as recited in claim 1, wherein the third abrasive include at least one of silicon carbide, boron nitride, diamond and oxides of the elements cerium, aluminum, silicon and zirconium.

8. The method as recited in claim 1, wherein step (d) includes introducing a polishing agent that is free of solids between the polishing pad and the front and rear sides of the semiconductor wafer.

9. The method as recited in claim 1, farther comprising providing the semiconductor wafer with a rounded edge before step (a).

10. The method as recited in claim 1, further comprising polishing an edge of the semiconductor wafer between step (e) and step (f).

11. The method as recited in claim 1, further comprising fixing the rear side of the semiconductor wafer on a carrier during steps (e) and (f) using a substantially uniform, thin cement layer having a thickness of at most 3 μm.

12. The method as recited in claim 1, further comprising holding the semiconductor wafer during steps (e) and (f) using a holding system that is fixed on a carrier, the holding system including a lined cutout having a size of the semiconductor wafer, the cutout receiving the semiconductor wafer by adhesion of the rear side of the semiconductor wafer in the cutout.

* * * * *